US00RE38736E

(19) United States
(12) Reissued Patent
Walse et al.

(10) Patent Number: US RE38,736 E
(45) Date of Reissued Patent: May 17, 2005

(54) CARD EDGE CONNECTOR WITH SYMMETRICAL BOARD CONTACTS

(75) Inventors: Alan S. Walse, LaGrange, IL (US); Harold Keith Lang, Fox River Grove, IL (US); Augusto P. Panella, Naperville, IL (US); Irvin R. Triner, Lemont, IL (US); Shyh-Lin Tung, Taipei (TW)

(73) Assignee: Molex Incorporated, Lisle, IL (US)

(21) Appl. No.: 10/051,925

(22) Filed: Jan. 17, 2002

Related U.S. Patent Documents

Reissue of:
(64) Patent No.: 6,015,299
Issued: Jan. 18, 2000
Appl. No.: 09/120,485
Filed: Jul. 22, 1998

(51) Int. Cl.[7] ..... H01R 12/00; H05K 1/00
(52) U.S. Cl. ..... 439/60
(58) Field of Search ..... 439/60, 636, 637

(56) References Cited

U.S. PATENT DOCUMENTS

| | | | |
|---|---|---|---|
| 3,196,377 | A | 7/1965 | Minich |
| 3,199,066 | A | 8/1965 | Eledge et al. |
| 3,399,372 | A | 8/1968 | Uberbacher |
| RE26,692 | E | 10/1969 | Ruehlemann |
| 3,539,976 | A | 11/1970 | Reynolds |
| 3,573,704 | A | 4/1971 | Tarver |
| 3,871,728 | A | 3/1975 | Goodman |
| 4,419,626 | A | 12/1983 | Cedrone et al. |
| 4,461,522 | A | 7/1984 | Bakermans et al. |
| 4,548,452 | A | 10/1985 | Gillett |
| 4,552,420 | A | 11/1985 | Eigenbrode |
| 4,705,332 | A | 11/1987 | Sadigh-Behzadi |
| 4,707,039 | A | 11/1987 | Whipple |
| 4,886,474 | A | 12/1989 | Drogo |
| 4,891,023 | A | 1/1990 | Lopata |
| 4,917,616 | A | 4/1990 | Demler, Jr. et al. |
| 4,950,172 | A | 8/1990 | Anhalt et al. |
| 4,973,260 | A | 11/1990 | Madore et al. |
| 5,024,609 | A | 6/1991 | Piorunneck |

(Continued)

FOREIGN PATENT DOCUMENTS

| | | |
|---|---|---|
| EP | 414495 | 8/1990 |
| EP | 436943 | 12/1990 |
| EP | 472203 | 8/1991 |
| JP | 5819884 | 5/1983 |
| JP | 479177 | 3/1992 |
| JP | 455764 | 5/1992 |
| JP | 4147577 | 5/1992 |
| TW | 280041 | 7/1996 |
| WO | 9204745 | 3/1992 |

OTHER PUBLICATIONS

Markstein, "Packaging for High–Speed Logic," pp. 48–50, Electronic Packaging & Production, Sep. 1987.

*Primary Examiner*—Javaid H. Nasri
(74) *Attorney, Agent, or Firm*—Cook, Alex, McFarron, Manzo, Cummings & Mehler, Ltd.

(57) ABSTRACT

A card edge connector for mounting on a circuit board and removeably receiving a circuit card includes an elongated housing defining a card receiving slot. Numerous terminal receiving cavities intersect and extend to both sides of the slot. Alternate cavities include stamped references (ground or power) terminals and signal terminals, all having downwardly extending board contacts and upwardly extending spring arms. There are numerous similar sets of face to face contacts, each including a reference contact parallel to and substantially overlying an opposed pair of signal contacts. The upwardly extending reference terminal spring arms include oversize pad portions for reducing crosstalk by increasing coupling between the reference and signal terminals. The circuit paths to the circuit board are in an array symmetrical about the centerline of the circuit card, with parallel inner lines of circuits containing only reference contacts and outer lines of circuits containing only signal contacts.

49 Claims, 3 Drawing Sheets

U.S. PATENT DOCUMENTS 5,026,292 A 6/1991 Pickles et al.
5,035,631 A 7/1991 Piorunneck et al.
5,035,632 A 7/1991 Rudoy et al.
5,051,099 A 9/1991 Pickles et al.
5,071,371 A 12/1991 Harwath et al.
5,082,459 A 1/1992 Billman et al.
5,096,435 A 3/1992 Noschese et al.
5,098,306 A 3/1992 Noschese et al.
5,156,554 A 10/1992 Rudoy et al.
5,158,471 A 10/1992 Fedder et al.
5,161,987 A 11/1992 Sinisi
5,162,002 A 11/1992 Regnier
5,192,220 A 3/1993 Billman et al.
5,224,867 A 7/1993 Ohtsuki et al.
5,249,988 A 10/1993 Lu
5,259,768 A 11/1993 Brunker et al.
5,259,793 A 11/1993 Yamada et al.
5,309,630 A 5/1994 Brunker et al.
5,336,111 A 8/1994 Thrush et al.
5,376,012 A 12/1994 Clark
5,393,234 A 2/1995 Yamada et al.
5,522,737 A 6/1996 Brunker et al.
5,580,257 A 12/1996 Harwath
6,287,132 B1 9/2001 Perino et al.

CARD EDGE CONNECTOR WITH SYMMETRICAL BOARD CONTACTS

Matter enclosed in heavy brackets [ ] appears in the original patent but forms no part of this reissue specification; matter printed in italics indicates the additions made by reissue.

BACKGROUND OF THE INVENTION

The present invention relates to electrical connectors for printed circuit boards, and more particularly to an improved card edge connector for removeably connecting a circuit card to a circuit board.

DESCRIPTION OF THE PRIOR ART

Devices such as computers using printed circuit boards are exhibiting increasing circuit densities and operate at increasing frequencies. For example, the speed of high frequency digital signals traveling between a computer motherboard and densely populated memory module printed circuit cards on an associated circuit board are becoming higher. These trends create problems for electrical connectors such as edge card connectors that are used to removeably mount a circuit card on a circuit board.

With increasing circuit density, the electrical connectors and the electrical terminals they include are smaller. The terminals must nevertheless be sufficiently flexible and strong to provide reliable contact with a circuit card inserted into the connector.

In addition, it is desirable to keep small the impedance of the circuit paths provided by the electrical terminals of the edge card connector. Meanwhile, inductance must be kept to a minimum, capacitance must be carefully controlled, and crosstalk between different signals must be minimized. These often conflicting goals have led to many approaches for connector and terminal design with varying degrees of success.

U.S. Pat. No. 5,161,987, for example, discloses an electrical connector having a ground bus with a plurality of solder tails. A row of signal contacts is located on each side of the ground bus.

U.S. Pat. No. 5,162,002, meanwhile, discloses a card edge connector with spatially overlapped terminals having relatively shorter and relatively longer contact elements.

This connector has important advantages such as reducing the peak card insertion force, but has electrical characteristics that are not optimized for higher speed digital signals.

U.S. Pat. No. 5,192,220 discloses a dual readout socket wherein crosstalk is reduced by increasing the space between connectors. This approach defeats the goal of increased circuit density.

U.S. Pat. No. 5,259,768 discloses an electrical connector having ground terminals with significantly larger surface areas than the signal terminals. The ground and signal terminals alternate, and the shadowing effect of the ground terminals reduces crosstalk. The ground terminals have both solder tails and grounding feet to reduce impedance generally, while non-functional stubs are sized to provide a specifically desired impedance.

U.S. Pat. No. 5,259,793 discloses an edge connector with terminals arranged in an alternating array along the circuit card insertion slot. Circuit density is diminished because of the alternating array.

U.S. Pat. No. 5,309,630 discloses an electrical connector wherein a desired impedance is obtained by selecting terminals having anchoring portions sized to correspond to the desired impedance. Signal and ground terminals may alternate, and at least the ground terminals are provided with two feet to reduce impedance.

U.S. Pat. No. 5,580,257 discloses a connector in which enlarged ground terminals are adjacent to pairs of signal terminals to reduce crosstalk. Although this arrangement has advantages, three different terminal shapes are required, and the operation of assembling terminals into the connector housing is complex.

Despite these and many other attempts, there remains a long-standing need for a card edge connector that can be made at reasonable cost, is robust and reliable, has high circuit density and performs well in high speed digital circuits.

SUMMARY OF THE INVENTION

An object of the present invention is to provide an improved card edge connector. Other objects are to provide a connector with low inductance that can achieve an impedance match with associated circuit assemblies; to provide a connector having minimum cross talk between signal circuits; to provide a connector having high circuit density; to provide a connector that is robust although small; to provide a mechanically and electrically reliable connector that can be manufactured and assembled inexpensively; and to provide an improved card edge connector overcoming disadvantages of connectors used in the past.

In accordance with the invention there is provided a card edge connector for interconnecting a printed circuit board having conductive contact regions and a removable printed circuit card having a mating edge with a plurality of conductive contact pads aligned on opposite surfaces of the card. The card edge connector includes an elongated insulating housing with opposed side walls and top and bottom walls. An elongated slot in the top wall receives the mating edge of the circuit card. The slot has an elongated centerline. A plurality of terminals include signal terminals for conducting signals between the contact pads of the circuit card and the contact regions of the circuit board and reference terminals for making ground and power connections between the contact pads and the contact regions. A plurality of transverse terminal receiving cavities extend between the side walls and extend to both sides of the slot. The terminals are mounted in the cavities. The cavities include signal cavities containing only signal terminals and reference cavities containing only reference terminals. The terminals include card contacts extending into the slot for contacting the contact pads of the inserted card and board contacts extending downward through the bottom wall for contacting the contact regions of the circuit board. The terminals in each signal cavity and each ground cavity include a pair of card contacts engageable with a pair of opposed card contact pads and a pair of board contacts at opposite sides of the centerline.

BRIEF DESCRIPTION OF THE DRAWING

The present invention together with the above and other objects and advantages may best be understood from the following detailed description of the preferred embodiment of the invention illustrated in the drawings, wherein.

DETAILED DESCRIPTION OF THE PREFERRED EMBODIMENTS

Figure 1:
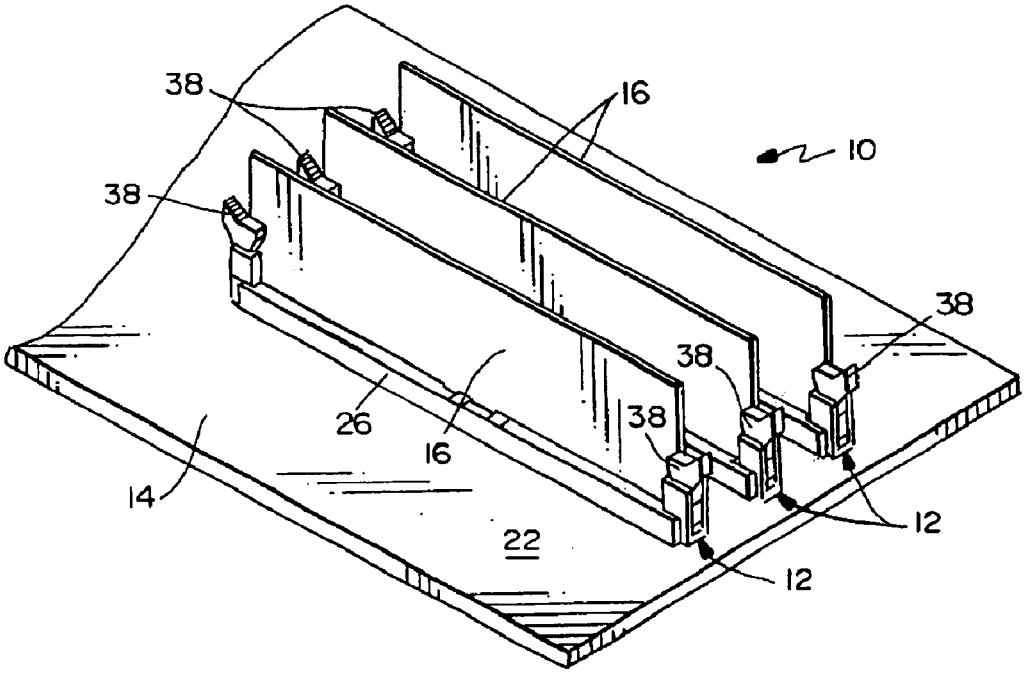
FIG. 1 is an isometric view of a printed circuit board assembly including card edge connectors embodying the present invention mounted on a circuit board and connecting removable circuit cards to the circuit board.

Having reference now to the drawings, in FIG. 1 there is illustrated a circuit assembly generally designated as 10 and including three card edge connectors, each generally designated as 12, constructed in accordance with the principles of the present invention. The circuit assembly 10 includes a printed circuit board 14, for example, a computer motherboard. The card edge connectors 12 are mounted on the circuit board 14 and removeably receive printed circuit cards 16, for example, memory modules with random access memory available to the motherboard 14. The card edge connector provides circuit paths so that power, ground and digital signals can be transferred between the circuit board 14 and the circuit cards 16.

Figure 8:
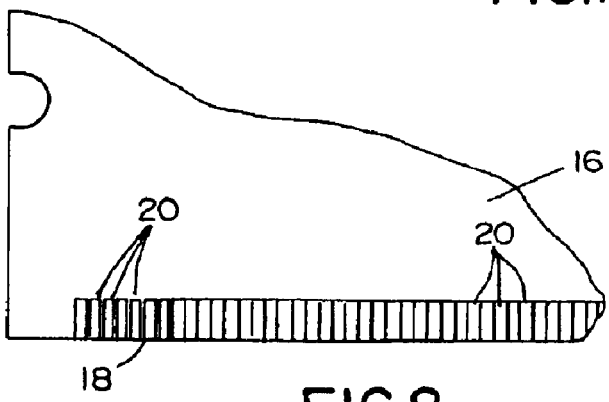
FIG. 8 is a side elevational, fragmentary view of a portion of a printed circuit card edge that mates with the card edge connector.
Figure 9:
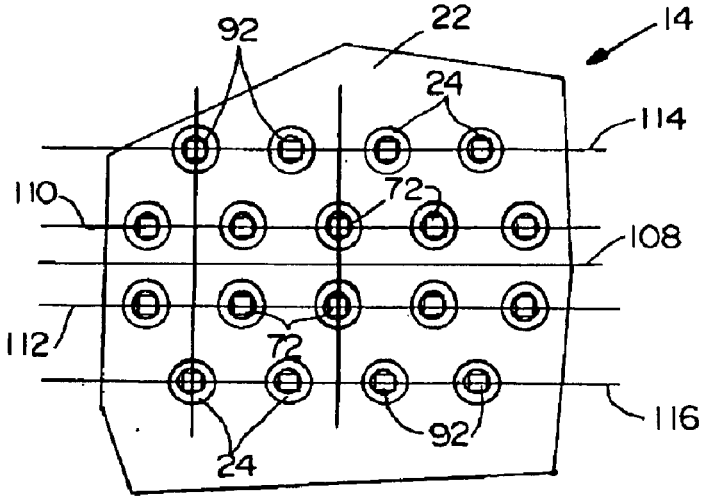
FIG. 9 is a fragmentary plan view of a portion of a circuit board upon which the edge card is mounted, with reference lines added to aid in the description of the invention.

The pertinent structure of the circuit card 16 and the circuit board 14 are shown in FIGS. 8 and 9. The card 16, of which a fragment is seen in FIG. 8, includes an edge 18 that mates with the card edge connector 12. A series of conductive contact pads 20 is provided on both opposed surfaces of the card 16 along the mating edge 18. Conductive traces on and/or within the card 16 provide power, ground and signal paths leading from the contact pads 20 to components (not shown) that are mounted on the card 16.

A fragment of the circuit board 14 is shown in FIG. 9. The upper surface 22 of the board includes an array of conductive regions 24. In the illustrated embodiment, the conductive regions 24 are plated through holes. Other arrangements, such as conductive pads for surface mount soldering connections, are also possible. Circuit traces on and/or in the circuit board 14 provide power, ground and signal paths from the conductive regions 24 to other components (not shown) mounted on the circuit board. When the card edge connector 12 is mounted on the circuit board 14 and when a circuit card 16 is inserted into the card edge connector 12, the connector 12 provides circuit paths between the contact pads 20 and the conductive regions 22.

Figure 2:
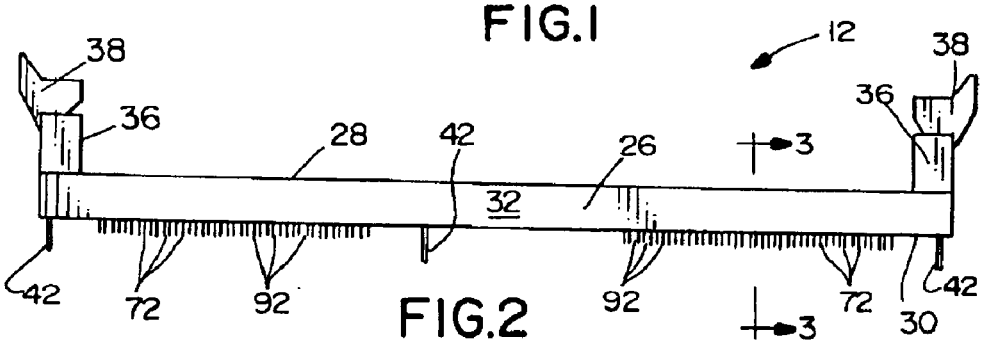
FIG. 2 is a side elevational view of one of the card edge connectors of FIG. 1.
Figure 3:
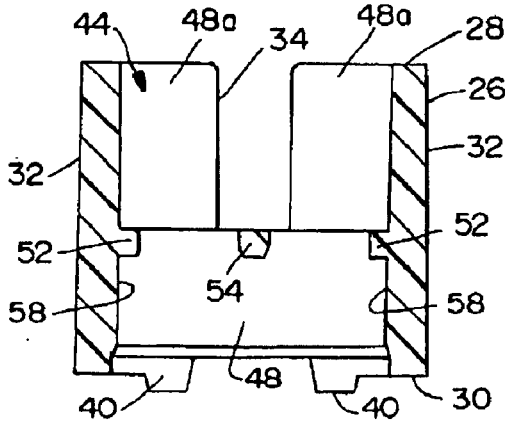
FIG. 3 is an enlarged vertical sectional view of the housing of the card edge connector taken along the line 3—3 of FIG. 2 and illustrating a terminal receiving cavity prior to mounting of terminals into the housing.

As seen in FIGS. 2 and 3, the card edge connector 12 includes an elongated housing 26 made of an electrically insulating material such as a molded high temperature thermoplastic, such as liquid crystal polymer plastic. The housing has a top wall 28, a bottom wall 30 and opposed side walls 32. An elongated card slot 34 in the top wall 28 receives the mating edge 18 of an inserted card 16. Housing end posts 36 and latches 38 may be provided at the ends of the housing 26. The bottom wall 30 includes stand off projections 40 for maintaining a space between the bottom wall 30 and the top surface 22 (FIG. 1) of the circuit board 14. Hold downs 42 are generally known in the art and may be used to mechanically attach the housing 26 to the circuit board 14.

Numerous terminal receiving cavities 44 (FIGS. 3 and 4) and 46 (FIG. 5) are provided in the housing 26. In the preferred embodiment of the invention, there may be over fifty cavities 44 and a similar number of cavities 46. Every cavity 44 is immediately adjacent to a cavity 46, and in the preferred embodiment of the invention, the cavities 44 and 46 alternate in position along of the length of the housing 26.

The cavities 44 and 46 are separated by internal separator walls or dividers 48 and extend transversely, perpendicular to the slot 34, between the side walls 32. The cavities 44 and 46 intersect and extend to both opposed sides of the slot 34. The bottom of the slot 34 has a stop surface 50 defined in part by the separator walls 48 and by terminal stop projections 52, spacers 54 in the cavities 44 and terminal retention walls 56 in the cavities 46. The separator walls 48 are connected across cavities 44 by spacer 54 that extends only slightly downward from the stop surface 50 of slot 34 On the other hand, separator walls 48 are connected across cavities 46 by terminal retention walls 56 that extend downward from the stop surface 50 of slot 34 substantially to the bottom of the housing 26. The side walls of the slot 34 are defined by the inner edges of comb-like upper portions 48a of the separator walls 48. The lower portions of the cavities 44 and 46 have opposed internal side walls 58. Each cavity 44 and 46 has an open bottom through which terminals may be inserted into the cavities.

Reference terminals 60 are mounted in the cavities 44. The term "reference terminal" is defined here to mean a terminal that provides ground or power connections between the circuit board 14 and the circuit card 16. Signal terminals 62 are mounted in the cavities 46. The term "signal terminal" is defined here to mean a terminal that provides a circuit path for the transmission of ac signals, typically high speed digital signals, between the circuit board 14 and the circuit card 16.

In the preferred embodiment, the reference terminals 60 are all identical to one another and the signal terminals 62 are all identical to one another. The terminals 60 and 62 are flat, planar bodies of metal of uniform thickness, preferably made by stamping from metal sheet stock without any other forming or bending operations. This provides a more efficient manufacturing operation and a sturdier and more reliable terminal in comparison with electrical connectors having terminals that are both stamped and formed. Preferably the terminals 60 and 62 are stamped of phosphor bronze and plated with tin and lead over nickel, with selective gold plating at electrical contact areas, though other alloys or conductive materials may be used.

Figure 4:
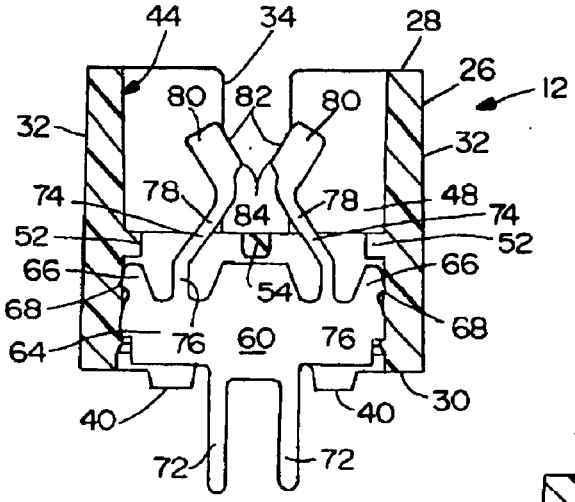
FIG. 4 is a sectional view similar to FIG. 3 illustrating a reference terminal mounted in a terminal receiving cavity.

In FIG. 4, one of the reference terminals 60 is seen in place in one of the cavities 44. The terminal 60 includes a generally rectangular, planar, plate like body 64 having upwardly extending retention arms 66 at both ends. The arms 66 have barbs 68 that engage the internal side walls 58 and resist removal of the terminal 60 after the terminal 60 is loaded into the cavity 44 through the bottom wall 30. Terminal insertion may be limited by engagement of the arms 66 against the projections 52 or by engagement of a central span portion 70 of the body 64 against the spacer 54. The reference terminal 60 extends across the full width of the cavity 44 and extends to both sides of the slot 34.

A pair of spaced apart board contacts 72 extend downward from the body 64. These contacts are received in the plated through conductive regions 24 of the circuit board 14 to connect the terminal 60 to the circuit board. The conductive regions 24 connected to the reference terminals 60 are at a reference voltage of ground or power supply potential. It is important that the connections made to reference voltage be of low impedance. The use of two spaced board contacts for the single reference terminal 60 results in parallel redundant circuit paths and low inductance.

A pair of opposed spring arms 74 extend upward from the body 64. Each spring arm 74 includes a flexible beam with a vertical portion 76 and an inwardly sloped portion 78. The end of the spring arm 74 includes a large segment 80 defining a lead-in surface 82 and a contact region 84. When the mating edge 18 of the circuit card 16 is inserted into the slot 34, an opposed pair of conductive pads 20 enter into each of the cavities 44. The mating edge 18 engages the opposed lead in surfaces 82 and the spring arms 74 resiliently deflect or separate. When the card 16 is fully inserted, the contact regions 84 engage the pads 20 to complete circuit paths from the terminal 60 to the opposed pair of pads 20. As such, redundant paths are provided between the circuit board 14 and the circuit card 16.

Figure 5:
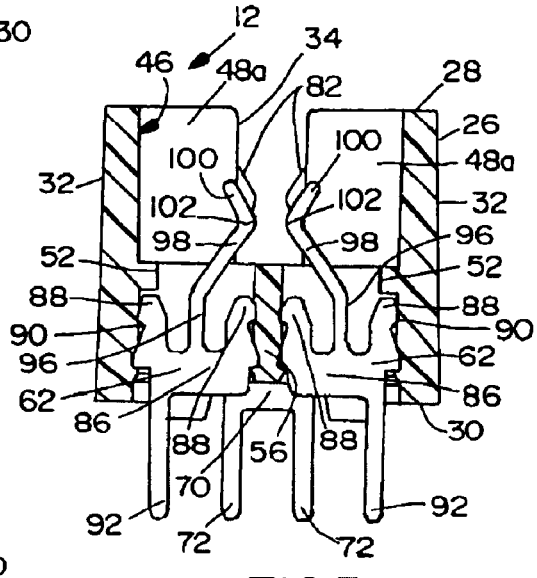
FIG. 5 is a view similar to FIG. 3 illustrating signal terminals mounted in a terminal receiving cavity.

Referring now to FIG. 5, a spaced apart pair of the signal terminals 62 are mounted in each of the cavities 46. The use of pairs of discrete signal terminals 62 rather than a single terminal such as reference terminal 60 permits a high circuit density. Each signal terminal 62 includes a generally rectangular, planar, plate like body 86 having upwardly extending retention arms 88 at both ends. The arms 88 have barbs 90 that retain the terminals 62 in the cavity 46. At the outer ends of the bodies 86, the arms 88 and barbs 90 engage the internal side walls 58. At the inner ends of the bodies 86, the arms 88 and barbs 90 engage opposite sides of the retention wall 56. Terminal insertion is limited by engagement of the arm 66 against the projection 52.

A board contact 92 extends downward from the body 86 of each of the terminals 62 in the cavity 46. These contacts 92 are received in the plated through conductive regions 24 of the circuit board 14 to connect the terminals 62 to the circuit board 14. The conductive regions 24 connected to the signal terminals 62 are used to communicate ac signals such as high frequency digital signals between the circuit board 14 and the circuit card 16. The board contacts 92 are transversely offset from the reference terminal board contacts 72 in a staggered pattern.

A spring arm 94 extends upward from each of the bodies 86. Each spring arm 94 includes a flexible beam with a vertical portion 96 and an inwardly sloped portion 98. The end of the spring arm 94 includes a lead-in surface 100 and a contact region 102. The two identical signal terminals 62 are loaded into opposite sides of the cavity 46 in reversed positions relative to one another. The two terminals 62 are at opposite sides of the slot 34, and because of the reverse orientation, the two opposed spring arms 94 slope toward one another at opposite sides of the slot 34.

When the mating edge 18 of the circuit card 16 is inserted into the slot 34, an opposed pair of conductive pads 20 enter into each of the cavities 46. The mating edge 18 engages the opposed lead-in surfaces 100 and the spring arms 94 resiliently deflect or separate. When the card 16 is fully inserted, the contact regions 102 engage the pads 20 to complete circuit paths from the terminals 62 to the opposed pair of pads 20. The use of two distinct terminals 62 in each cavity 46 permits independent signal connections to be made to the opposed contact pads 20 at opposite sides of the circuit card 16.

Figure 6:
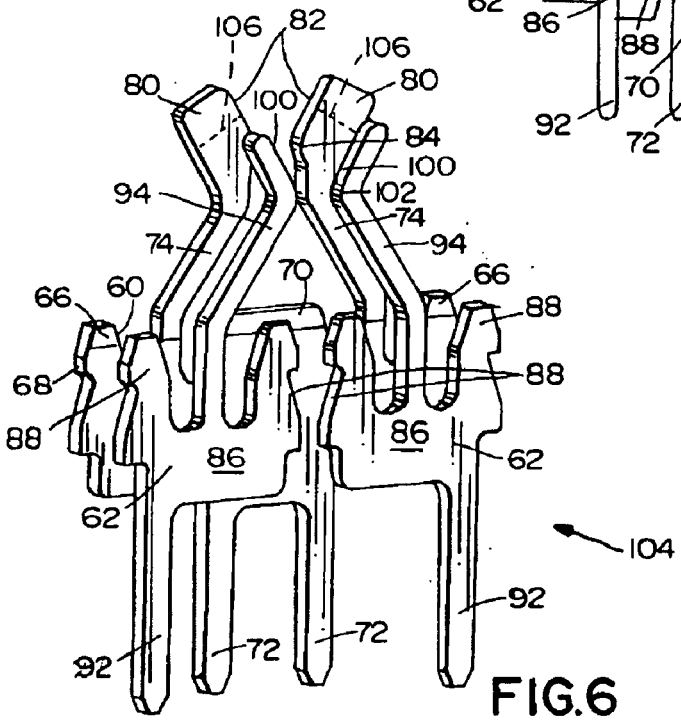
FIG. 6 is an isometric view of a reference terminal and an adjacent pair of signal terminals as they are mounted in the housing of the card edge connector, but with the connector housing removed to reveal the terminals.
Figure 7:
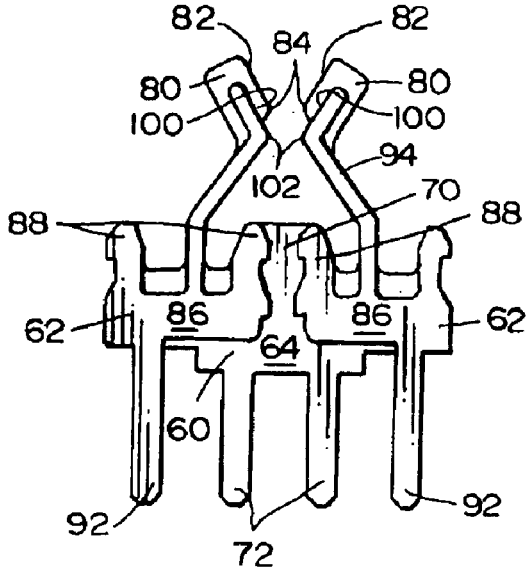
FIG. 7 is a side elevational view illustrating a pair of signal terminals in front of a reference terminal as they are mounted in the housing of the card edge connector, but with the connector housing removed to reveal the terminals.

Because every signal terminal cavity 46 is immediately adjacent to one of the reference terminal cavities 44, the connector 12 of the present invention includes numerous terminal sets generally designated as 104, each including closely spaced and interfacing reference and signal terminals 60 and 62. One of these many terminal sets 104 is shown in FIGS. 6 and 7 with the housing 26 omitted to reveal more of the structure of the terminal set. In the preferred embodiment of the invention, each set 104 includes a single reference terminal 60 and an opposed pair of signal terminals 62 but principles of the invention can apply to other arrangements including two reference and two signal terminals or one reference and one signal terminal in each set. In the preferred embodiment, the reference terminal cavities 44 alternate with the signal terminal cavities 46, but there could be other configurations such as two adjacent signal terminal cavities 44 between each pair of reference terminal cavities.

As seen in FIGS. 6 and 7, in each terminal set 104 the reference terminal 60 is parallel to and close to the pair of signal terminals 62. The reference terminal 60 substantially entirely overlies or shadows the signal terminals 62. The reference terminal body 64 entirely overlies the signal terminal bodies 86. The reference terminal body is enlarged beyond the extent of the signal terminal bodies 86 by the provision of the central span portion 70 and by downwardly extending the body 64 at the bases of the board contacts 72 as seen in FIG. 7. The signal terminal inner retention arms 88 are overlaid by the retention arms 66 and by the span portion 70. The signal terminal contact beams 74 are overlaid by the reference terminal contact beams 94 except for the small contact regions 102. This construction maximizes coupling of the signal terminals 62 to the reference terminal 60 and minimizes crosstalk between signal paths. The relatively massive structure of the reference terminal 60 reduces inductive impedance.

The enlarged segments 80 of the reference terminal contact arms 74 provide a large surface area overlying the ends of the signal terminal contact arms 94. Because these segments are larger than required for the conventional mechanical and electrical functions of the contact arms 74, they are defined as "oversize". The oversize segments 80 provide several important functions. They increase coupling to the signal terminals 62 without significantly adding mass to functional parts of the terminal and possibly impeding mechanical operation. They provide a sturdy and rugged card lead-in area. The use of numerous such reference terminals 60 all having oversize segments in a symmetrical array at both sides of the circuit card 16 provides increased electrostatic shielding of circuits on both sides of the circuit card 16.

Another advantage of the oversize segments 80 is that the size of the segments 80 can be changed to adjust terminal impedance without interfering with the operation of the terminal. The segments could be reduced in length by having them extend only to the broken lines designated as 106 in FIG. 6. The resulting terminal would have an impedance different from a terminal as illustrated with larger segments 80. Though other sections of the terminal may need to be corresponding resized, this feature permits the terminal to be tailored or tuned to specific impedance requirements without interfering with the mechanical function of the terminal.

As can best be seen in FIG. 7, the reference terminal contact regions 102 are at a higher elevation than the signal terminal contact regions 84. When the mating edge 18 of the circuit card 16 is inserted into the slot 34, it first contacts the reference terminal contact arms 74 and reacts against the lead-in surfaces 82 to resiliently deflect or separate the arms 74. Thereafter, the mating card edge 18 contacts the signal terminal lead-in surfaces 100 and deflects or separates the signal terminal contact arms 94. Peak insertion forces are reduced by separating these two contact engagement actions.

The card edge connector 12 of the present invention provides an advantageous array of circuit paths between the circuit board 14 and the terminals 60 and 62. FIG. 9 illustrates a fragmentary portion of the circuit board 14 showing the array of plated through hole conductive regions 24 through which extend board contacts 72 and 92. A reference line 108 identifies the longitudinal centerline of the array, coinciding with the longitudinal centerline of the slot 34 and the center of the inserted circuit card 16. An important feature of the circuit path array is that all the circuits are symmetrical about this centerline 108.

The conductive regions 24 and the board contacts 72 and 92 inserted therein are located in four lines all parallel to the centerline 108, two inner lines 110 and 112 and two outer lines 114 and 116. The inner lines 110 and 112 are closer to the centerline 108 than are the outer lines 114 and 116. In the preferred embodiment, the lines 110, 112, 114 and 116 are equally spaced, but if desired the lines 110 and 112 could be spaced farther apart while maintaining symmetry around the centerline 108.

The inner lines 110 and 112 of conductive regions 24 receive only the contacts of a single type of terminal and the outer lines 114 and 116 receive only the contacts of the other type of terminal. In the illustrated arrangement, the inner lines 110 and 112 of through holes 24 receive only the reference terminal board contacts 72 and the outer lines 114 and 116 receive only signal terminal board contacts 92.

Every reference terminal board contact 72 is transversely aligned with and spaced an equal distance from the centerline 108 as another reference terminal contact 72. A transverse line 118 intersects two contacts 72 and illustrates this relationship. Every signal terminal contact 92 also is transversely aligned with and spaced an equal distance from the centerline 108 as another signal terminal contact 92. Another transverse line 120 intersects two contacts 92 and illustrates this relationship.

The circuit path array resulting from the present invention can facilitate routing of conductive traces on the circuit board 14 in comparison with conventional asymmetrical circuit arrays. In addition, the symmetrical array is a characteristic of a terminal pattern that facilitates connector manufacture and assembly.

In the preferred embodiment of the invention, the board contacts 72 and 92 are solder tails that are soldered to the plated through holes 24 of the circuit board 14. Other types of board contacts such as surface mount feet may be used, while retaining the advantages of the present invention. In addition, for some applications, it may be possible to utilize only one board contact for the reference terminals 60.

While the present invention has been described with reference to the details of the embodiment of the invention shown in the drawing, these details are not intended to limit the scope of the invention as claimed in the appended claims.

We claim:

1. An electrical circuit assembly comprising a printed circuit board having a plurality of conductive regions, an electrical connector having an elongated insulated housing with a longitudinal axis, a plurality of generally planar, electrical terminals mounted in said housing, the plane of each electrical terminal being generally perpendicular to said longitudinal axis, and each electrical terminal having at least one board contact extending from said housing for connection to said conductive regions, said board contacts and said conductive regions defining a plurality of conductive paths extending between said circuit board and said connector, said conductive paths being of two types, a first type being signal paths for carrying high frequency signals and a second type being reference paths for carrying ground and power signals, each of said paths including one of said board contacts and one of said conductive regions, said paths being arrayed as follows:

said paths being arrayed solely along two opposed inner lines and two opposed outer lines, each said line being generally parallel to the longitudinal axis of said housing;

each said path in one of said inner lines being laterally aligned with a path in the other of said inner lines to define pairs of inner paths and each said path in one of said outer lines being laterally aligned with a path in the other of said outer lines to define pairs of outer paths; and said paths of said first type all being positioned along said inner lines and said paths of said second type all being positioned along said outer lines.

2. An electrical circuit assembly as claimed in claim 1 wherein said inner lines include only reference paths and said outer lines include only signal paths.

3. An electrical circuit assembly as claimed in claim 2 wherein every pair of laterally aligned signal paths in said outer lines is laterally adjacent an aligned pair of reference paths in said inner lines.

4. An electrical circuit assembly as claimed in claim 2 wherein every pair of laterally aligned signal paths in said outer lines is laterally between two aligned pairs of reference paths in said inner lines.

5. An electrical connector assembly as claimed in claim 1 wherein said board contacts are solder tails and said conductive regions are plated through holes.

6. A card edge connector for interconnecting a printed circuit board having conductive contact regions and a removable printed circuit card having a mating edge with a plurality of conductive contact pads, said card edge connector comprising:

an elongated housing formed of insulating material and having a mating surface;

an elongated slot in said mating surface of said housing for receiving said mating edge of said circuit card, said slot having an elongated centerline therealong coinciding with the center of said circuit card when mated;

a plurality of transversely extending terminal receiving cavities in said housing, each cavity extending to both sides of said slot; and a plurality of conductive terminals mounted in said cavities, said terminals including first and second groups of terminals, one of said groups being signal terminals for conducting signals between said contact pads of said circuit card and said contact regions of said circuit board, the other of said groups being reference terminals for making ground and power connections between others of said contact pads and said contact regions;

said terminals being generally planar and including spring arms extending into said slot for contacting said contact pads of said circuit card when inserted therein and board contacts extending from said housing for contacting said contact regions of said circuit board;

said board contacts for all of the signal and reference terminals mounted in said housing cavities being generally arrayed solely in four lines parallel to said centerline, said four lines including an inner line and an outer line on each side of said centerline;

wherein two of said board contacts extend from each cavity;

wherein both of said board contacts extending from each cavity are from the same group of terminals, said inner lines include only board contacts of said first group of terminals and said outer lines include only board contacts of said second group of terminals.

7. A card edge connector as claimed in claim 6 wherein said first group of terminals are said reference terminals and said second group of terminals are said signal terminals.

8. A card edge connector as claimed in claim 7 wherein each cavity containing at least one of said signal terminals is adjacent to a cavity containing at least one of said reference terminals.

9. A card edge connector as claimed in claim 8 wherein each cavity containing at least one of said signal terminals is between two cavities containing at least one of said reference terminals.

10. A card edge connector as claimed in claim 6 wherein said terminals are flat, planar stamped plates of metal.

11. A card edge connector as claimed in claim 10 wherein said board contacts are solder tails.

12. A card edge connector as claimed in claim 6 wherein each said signal terminal includes one of said spring arms and one said board contacts and two of said signal terminals are mounted in each cavity with one of said signal terminal on each side of said slot.

13. A card edge connector as claimed in claim 6 wherein each said reference terminal includes two of said spring arms and two of said board contacts and said reference terminals are mounted one to a cavity with said spring arms and board contacts on opposite sides of said slot.

14. A card edge connector comprising:

an elongated insulative housing including an elongated circuit card receiving slot having a longitudinal axis;

a plurality of terminal receiving cavities extending perpendicularly to said slot and extending to both sides of said slot;

a plurality of terminals mounted in said cavities;

said terminals including a plurality of identical terminal sets mounted in parallel face-to-face relation in adjacent ones of said terminal receiving cavities;

each of said terminal sets including a reference terminal in one cavity extending to both sides of said slot and a pair of identical signal terminals in said adjacent cavity;

said signal terminals being oppositely oriented and being disposed on opposite sides of said slot; and said reference terminal having a generally planar, plate-like body including a pair of flexible spring arms extending upwardly from said body and a pair of board contacts extending downwardly from said body, the plane of said body being generally perpendicular to said longitudinal axis of said slot.

15. The card edge connector of claim 14 wherein said signal terminals having a generally planar, plate-like body and a single flexible spring arm extending upwardly from said body and a single board contact extending downwardly from said body, said body being generally perpendicular to said longitudinal axis of said slot.

16. A card edge connector for interconnecting a printed circuit board having conductive contact regions and a removable printed circuit card having a mating edge with a plurality of conductive contact pads, said card edge connector comprising:

an elongated housing formed of insulating material and having a mating surface;

an elongated slot in said mating surface of said housing for receiving said mating edge of said circuit card, said slot having an elongated centerline therealong coinciding with the center of said circuit card when mated;

a plurality of transversely extending terminal receiving cavities in said housing, each cavity extending to both sides of said slot; and a plurality of conductive first and second terminals mounted in said cavities, said first and second terminals being differently configured, said terminals including spring arms with contact portions extending into said slot for contacting said contact pads of said circuit card when inserted therein and board contacts extending from said housing for contacting said contact regions of said circuit board, said contact portions of one of said first and second terminals being closer to said mating surface than said contact portions of the other of said first and second terminals, said first terminals being generally planar;

said board contacts for all of the first and second terminals mounted in said housing cavities being arrayed solely in four lines parallel to said centerline, said four lines including an inner line and an outer line on each side of said centerline;

wherein two of said board contacts extend from each cavity;

wherein said board contacts of said first terminals lie only in said inner lines and said board contacts of said second terminals lie only in said outer lines.

17. A card edge connector as claimed in claim 16 wherein said first terminals are reference terminals and said second terminals are signal terminals.

18. A card edge connector as claimed in claim 17 wherein each cavity containing at least one of said signal terminals is adjacent to a cavity containing at least one of said reference terminals.

19. A card edge connector as claimed in claim 18 wherein each cavity containing at least one of said signal terminals is between two cavities containing at least one of said reference terminals.

20. A card edge connector as claimed in claim 16 wherein said terminals are flat, planar stamped plates of metal.

21. A card edge connector as claimed in claim 20 wherein said board contacts are solder tails.

22. A card edge connector as claimed in claim 16 wherein each said signal terminal includes one of said spring arms and one of said board contacts and two of said signal terminals are mounted in each cavity with one of said signal terminal on each side of said slot.

23. A card edge connector as claimed in claim 16 wherein each said reference terminal includes two of said spring arms and two of said board contacts and said reference terminals are mounted one to a cavity with said spring arms and board contacts on opposite sides of said slot.

*24. A connector for interconnecting a printed circuit board having conductive contact regions and a removable electrical component having a mating portion with a plurality of conductive contacts, said connector comprising:*

*an elongated housing formed of insulating material and having a mating surface;*

*an opening in said mating surface of said housing for receiving said mating portion of said electrical component, said opening having an elongated centerline;*

*a plurality of transversely extending terminal receiving cavities in said housing, said cavity extending to both sides of said opening; and*

*a plurality of conductive terminals mounted in said cavities, said terminals including first and second groups of terminals, one of said groups being signal terminals for conducting signals between said contacts of said electrical component and said contact regions of said circuit board, the other of said groups being reference terminals for making ground and power connections between others of said contacts and said contact regions;*

*said terminals being generally planar and including spring arms extending into said opening for contacting said contacts of said electrical component when inserted therein and board contacts extending from said housing for contacting said contact regions of said circuit board;*

*said board contacts for all of the signal and reference terminals mounted in said housing cavities being generally arrayed solely in four lines parallel to said centerline, said four lines including an inner line and an outer line on each side of said centerline;*

*wherein two of said board contacts extend from each cavity;*

*wherein both of said board contacts extending from each cavity are from the same group of terminals, said inner lines include only board contacts of said first group of terminals and said outer lines include only board contacts of said second group of terminals.*

*25. A connector as claimed in claim 24 wherein said first group of terminals are said reference terminals and said second group of terminals are said signal terminals.*

*26. A connector as claimed in claim 25 wherein each cavity containing at least one of said signal terminals is adjacent to a cavity containing at least one of said reference terminals.*

*27. A connector as claimed in claim 26 wherein each cavity containing at least one of said signal terminals is between two cavities containing at least one of said reference terminals.*

*28. A connector as claimed in claim 24 wherein said terminals are flat, planar stamped plates of metal.*

*29. A connector as claimed in claim 28 wherein said board contacts are solder tails.*

*30. A connector as claimed in claim 24 wherein each said signal terminal includes one of said spring arms and one of said board contacts, and two of said signal terminals are mounted in each cavity with one of said signal terminals on each side of said opening.*

*31. A connector as claimed in claim 24 wherein each said reference terminal includes two of said spring arms and two of said board contacts, and said reference terminals are mounted one to a cavity with said spring arms and board contacts on opposite sides of said opening.*

*32. A connector comprising:*

*an elongated insulative housing including an opening having a longitudinal axis;*

*a plurality of terminal receiving cavities extending perpendicularly to said opening and extending to both sides of said opening;*

*a plurality of terminals mounted in said cavities, said terminals including a plurality of identical terminal sets mounted in parallel face-to-face relation in adjacent ones of said terminal receiving cavities;*

*each of said terminal sets including a reference terminal in one cavity extending to both sides of said opening and a pair of identical signal terminals in said adjacent cavity;*

*said signal terminals being oppositely oriented and being disposed on opposite sides of said opening; and*

*said reference terminal having a generally planar, plate-like body including a pair of flexible spring arms extending upwardly from said body and a pair of board contacts extending downwardly from said body, the plane of said body being generally perpendicular to said longitudinal axis of said opening.*

*33. The connector of claim 32 wherein said signal terminals having a generally planar, plate-like body and a single flexible spring arm extending upwardly from said body and a single board contact extending downwardly from said body, said body being generally perpendicular to said longitudinal axis of said opening.*

*34. A card edge connector for interconnecting a printed circuit board having conductive contact regions and a removable printed circuit card having a mating edge with a plurality of conductive contact pads, said card edge connector comprising:*

*an elongated housing formed of insulating material and having a mating surface;*

*an elongated slot in said mating surface of said housing for receiving said mating edge of said circuit card, said slot having an elongated centerline;*

*a plurality of transversely extending terminal receiving cavities in said housing, each cavity extending to both sides of said slot; and*

*a plurality of conductive first and second terminals mounted in said cavities, said first and second terminals being differently configured, said terminals including spring arms with contact portions extending into said slot for contacting said contact pads of said circuit card when inserted therein and board contacts extending from said housing for contacting said contact regions of said circuit board, said contact portions of one of said first and second terminals being closer to said mating surface than said contact portions of the other of said first and second terminals, said first terminals being generally planar;*

*said board contacts for all of the first and second terminals mounted in said housing cavities being arrayed solely in four lines parallel to said centerline, said four lines including an inner line and an outer line on each side of said centerline;*

*wherein two of said board contacts extend from each cavity;*

*wherein said board contacts of said first terminals lie only in said inner lines and said board contacts of said second terminals lie only in said outer lines.*

*35. A card edge connector as claimed in claim 34 wherein said first terminals are reference terminals and said second terminals are signal terminals.*

*36. A card edge connector as claimed in claim 35 wherein each cavity containing at least one of said signal terminals is adjacent to a cavity containing at least one of said reference terminals.*

*37. A card edge connector as claimed in claim 36 wherein each cavity containing at least one of said signal terminals*

*is between two cavities containing at least one of said reference terminals.*

*38. A card edge connector as claimed in claim 34 wherein said terminals are flat, planar stamped plates of metal.*

*39. A card edge connector as claimed in claim 38 wherein said board contacts are solder tails.*

*40. A card edge connector as claimed in claim 34 wherein each said signal terminal includes one of said spring arms and one of said board contacts, and two of said signal terminals are mounted in each cavity with one of said signal terminals on each side of said slot.*

*41. A card edge connector as claimed in claim 34 wherein each said reference terminal includes two of said spring arms and two of said board contacts, and said reference terminals are mounted one to a cavity with said spring arms and board contacts on opposite sides of said slot.*

*42. A connector for interconnecting a printed circuit board having conductive contact regions and a removable electrical component having a mating portion with a plurality of conductive contacts, said connector comprising:*

*an elongated housing formed of insulating material and having a mating surface;*

*an elongated opening in said mating surface of said housing for receiving said mating portion of said electrical component, said opening having an elongated centerline;*

*a plurality of transversely extending terminal receiving cavities in said housing, each cavity extending to both sides of said opening; and*

*a plurality of conductive first and second terminals mounted in said cavities, said first and second terminals being differently configured, said terminals including spring arms with contact portions extending into said opening for contacting said contacts of said electrical component when inserted therein and board contacts extending from said housing for contacting said contact regions of said circuit board, said contact portions of one of said first and second terminals being closer to said mating surface than said contact portions of the other of said first and second terminals, said first terminals being generally planar;*

*said board contacts for all of the first and second terminals mounted in said housing cavities being arrayed solely in four lines parallel to said centerline, said four lines including an inner line and an outer line on each side of said centerline;*

*wherein two of said board contacts extend from each cavity;*

*wherein said board contacts of said first terminals lie only in said inner lines and said board contacts of said second terminals lie only in said outer lines.*

*43. A connector as claimed in claim 42 wherein said first terminals are reference terminals and said second terminals are signal terminals.*

*44. A connector as claimed in claim 43 wherein each cavity containing at least one of said signal terminals is adjacent to a cavity containing at least one of said reference terminals.*

*45. A connector as claimed in claim 44 wherein each cavity containing at least one of said signal terminals is between two cavities containing at least one of said reference terminals.*

*46. A connector as claimed in claim 42 wherein said terminals are flat, planar stamped plates of metal.*

*47. A connector as claimed in claim 46 wherein said board contacts are solder tails.*

*48. A connector as claimed in claim 42 wherein each said signal terminal includes one of said spring arms and one of said board contacts, and two of said signal terminals are mounted in each cavity with one of said signal terminals on each side of said slot.*

*49. A connector as claimed in claim 42 wherein each said reference terminal includes two of said spring arms and two of said board contacts, and said reference terminals are mounted one to a cavity with said spring arms and board contacts on opposite sides of said opening.*

* * * * *